(12) United States Patent
Monteverde et al.

(10) Patent No.: US 12,234,546 B2
(45) Date of Patent: Feb. 25, 2025

(54) GOLD NICKEL ALLOY LAYER HAVING NITROGEN ATOMS INSERTED THEREIN AND RELATED PROCESSING METHOD

(71) Applicant: IONICS SA, Herstal (BE)

(72) Inventors: Fabien Monteverde, Mons (BE); Thomas Godfroid, Mons (BE); Luc Langer, Herstal (BE); Fabian Renaux, Herstal (BE)

(73) Assignee: IONICS SA, Herstal (BE)

( * ) Notice: Subject to any disclaimer, the term of this patent is extended or adjusted under 35 U.S.C. 154(b) by 0 days.

(21) Appl. No.: 18/000,789

(22) PCT Filed: Jun. 4, 2021

(86) PCT No.: PCT/EP2021/065049
§ 371 (c)(1),
(2) Date: Dec. 5, 2022

(87) PCT Pub. No.: WO2021/249891
PCT Pub. Date: Dec. 16, 2021

(65) Prior Publication Data
US 2023/0220541 A1  Jul. 13, 2023

(30) Foreign Application Priority Data

Jun. 8, 2020 (BE) .................. 2020/5406

(51) Int. Cl.
| | |
|---|---|
| *C23C 14/48* | (2006.01) |
| *C22C 5/02* | (2006.01) |
| *C23C 14/14* | (2006.01) |
| *H01R 13/03* | (2006.01) |

(52) U.S. Cl.
CPC ............... *C23C 14/48* (2013.01); *C22C 5/02* (2013.01); *C23C 14/14* (2013.01); *H01R 13/03* (2013.01)

(58) Field of Classification Search
CPC ............ C23C 14/48; C23C 14/14; C22C 5/02
USPC ............................................ 428/673
See application file for complete search history.

(56) References Cited

FOREIGN PATENT DOCUMENTS

| | | | |
|---|---|---|---|
| EP | 2070695 A1 | | 6/2009 |
| JP | 2003082452 A | * | 3/2003 |
| WO | 2005/121395 A1 | | 12/2005 |
| WO | 2021/249891 A1 | | 12/2021 |

OTHER PUBLICATIONS

Hamano et al., JP-2003082452-A Google Patents machine translation printed Mar. 28, 2024, Mar. 19, 2003, entire translation (Year: 2003).*
ISR-WO for parent application PCT/EP2021/065049 (WO2021/249891) dated Aug. 3, 2021.

* cited by examiner

*Primary Examiner* — Katherine A Christy
(74) *Attorney, Agent, or Firm* — Vorys, Sater, Seymour and Pease LLP

(57) ABSTRACT

A gold nickel layer may comprise nitrogen inserted over a thickness equal to or greater than 0.20 nm, characterized in that the atomic concentration of gold is at least 15% over said thickness, the atomic concentration of nickel is at least 10% over said thickness and the atomic concentration of nitrogen is at least 5% over said thickness. A connector may comprise a portion of a surface which comprises such a gold nickel layer. A process for treating a gold nickel layer may comprise a step of implantation of nitrogen ions, emitted by an energy source of at least 20 keV, and wherein the implanted nitrogen ions are multi-energy ions.

13 Claims, No Drawings

GOLD NICKEL ALLOY LAYER HAVING NITROGEN ATOMS INSERTED THEREIN AND RELATED PROCESSING METHOD

FIELD OF THE INVENTION

The subject of the invention is a layer of gold alloy comprising inserts of nitrogen, as well as a process for treating a gold alloy, in order to obtain such a layer. The invention also relates to a part comprising at least a portion on the surface of which is disposed such a layer.

As such, it implements a device for ion implantation of a piece of gold alloy from a beam of nitrogen ions emitted by an ion source.

BACKGROUND

The invention has applications for example in the field of goldsmithing and watchmaking. It is important to treat gold alloy parts to harden the surface and thus prevent the appearance of scratches for goldsmithing and watchmaking.

The invention can also find applications in the field of electrical circuits and/or electronics, such as the use of gold plated connectors. In the field of gold plated connectors, it is important that gold remains on the connector. Furthermore, it is important that alloys which improve the mechanical properties of gold maintain the desired conductivity properties of gold.

Gold a noble metal like copper and silver. The peripheral electron of gold is strongly attached to its atom. Gold is very difficult to ionize, it does not oxidize and does not corrode. It has desirable electrical conductivity as well. However, pure gold has lacking mechanical properties. In particular it is very ductile and very malleable. Pure gold is not hard enough to find applications for example in the field of tools.

Goldsmithing uses very little pure gold, which is too soft; it prefers gold alloys with better mechanical properties. In contrast, pure gold is very popular in the field of microelectronics for its good electrical conductivity and its stainless character. However, when used in connectors gold is removed from the surface over time due to mechanical wear. This leads to gold plated connectors being very expensive due to over dimensioning, or not sufficiently durable.

The hardness of gold depends on many factors including the composition of the alloys and the manner in which the pieces are worked. To combine the gold with other elements has the effect of reinforcing its hardness, its mechanical resistance, and to reduce in return its ductility and malleability.

An issue with alloys is that mechanical properties such as hardness, mechanical resistance are often improved at the expense of electrical conductivity.

In addition, chlorine or acidity from sweat may tarnish a gold alloy by reacting with some non-gold atomic species of the alloy. As we have seen, sweat can also tarnish the shine by reacting chemically with certain elements of the gold alloy. It is desired to improve chemical resistance.

As a general rule, metal nitrides are well known in metallurgy to increase the hardness, reduce the corrosive action of acids or chlorine. Among these nitrides are found nitrides of aluminum, titanium or those produced in steels. For gold, nitriding is however more difficult, even exceptional.

A method for nitriding gold is known from EP 2 066 829.

Another process for nitriding gold, the result of which results in a deposit of gold nitride on a silicon wafer, is described in document WO2005121395

SUMMARY OF THE INVENTION

The present invention and embodiments thereof serve to provide a solution to one or more of above-mentioned disadvantages. To this end, the present invention relates to a gold nickel layer according to claim 1.

Preferred embodiments of the device are shown in any of the claims 2 to 8. A specific preferred embodiment relates to an invention according to claim 4. Claim 4 relates to a gold-on-nickel layer, wherein gold is nitrated and both gold and nickel are partially diffused into one another. The inventors have found that such a double layered setup has conductivity and chemical resistance similar to that of pure gold, with improved mechanical properties such as hardness.

A specific preferred embodiment relates to an invention according to claim 8. Unlike claim 4, this relates to a homogeneous layer of gold-nickel-nitrogen alloy.

Surprisingly, very similar properties are noted with good conductivity and high mechanical resistance.

In a second aspect, the present invention relates to a process comprising: a gold dominant layer at the surface, characterized by an atomic concentration profile of at least 90% gold between a depth of 0.05 μm and 0.20 μm; and a nickel dominant layer between said gold dominant layer and a substrate, wherein said nickel dominant layer is characterized by an atomic concentration profile of at lease 90% nickel at a depth equal or greater than 0.20 μm and a layer thickness of at least 0.20 μm; said process comprising a step of implantation of nitrogen ions, emitted by an energy source of at least 20 keV, preferably at least 30 keV and wherein the implanted nitrogen ions are multy-energy ions. More particular, the process provides a gold-nickel layer according to the first aspect.

In a third aspect the present invention relates to a connector which consists of a gold nickel layer comprising nitrogen inserted over a thickness equal to or greater than 0.20 μm, characterized in that the atomic concentration of gold is at least 15% over said thickness, the atomic concentration of nickel is at least 10% over said thickness and the atomic concentration of nitrogen is at least 5% over said thickness. That connector has good conductivity (and thus good connectivity) and improved wear resistance. The improved wear resistance allows a guarantee for the connectivity in time. This unlike the noticeable reduction in properties of gold plated connectors known in the art.

DETAILED DESCRIPTION OF THE INVENTION

The present invention concerns a gold-nickel layer impregnated with nitrogen atoms.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

As used herein, the following terms have the following meanings:

"A", "an", and "the" as used herein refers to both singular and plural referents unless the context clearly dictates otherwise. By way of example, "a compartment" refers to one or more than one compartment.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed invention. However, it is to be understood that the value to which the modifier "about" refers is itself also specifically disclosed.

"Comprise", "comprising", and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, element, members, steps, known in the art or disclosed therein.

The recitation of numerical ranges by endpoints includes all numbers and fractions subsumed within that range, as well as the recited endpoints.

The expression "% by weight", "weight percent", "% wt" or "wt %", here and throughout the description unless otherwise defined, refers to the relative weight of the respective component based on the overall weight of the formulation. With respect to gold in particular, gold alloys are classified according to the amount of gold they comprise (expressed as mass % or wt. %). For example, 24 carat gold is substantially pure gold; 22 carat gold comprises substantially 91.6% of gold, between 0 and 8.4% of silver and between 0 and 8.4% of copper; 18-carat gold comprises substantially 75% gold, between 4.5 and 25% silver and between 0 and 20.5% copper; the 14 carat gold comprises substantially 58.5% of gold, between 9 and 41.5% of silver and between 8 and 32.5% of copper.

The hardness of these annealed alloys varies in general between 20 and 150 HV (Vickers hardness) depending on the silver and copper levels. These alloys can be hardened by work hardening which can substantially double their hardness and reach respectively hardnesses of the order of 50 to 300 HV. It is customary to consider that hardness greater than 300 HV cannot be achieved with conventionally processed gold alloys.

Whereas the terms "one or more" or "at least one", such as one or more or at least one member(s) of a group of members, is clear per se, by means of further exemplification, the term encompasses inter alia a reference to any one of said members, or to any two or more of said members, such as, e.g., any ≥3, ≥4, ≥5, ≥6, or ≥7 etc. of said members, and up to all said members.

Unless otherwise defined, all terms used in disclosing the invention, including technical and scientific terms, have the meaning as commonly understood by one of ordinary skill in the art to which this invention belongs. By means of further guidance, definitions for the terms used in the description are included to better appreciate the teaching of the present invention. The terms or definitions used herein are provided solely to aid in the understanding of the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to a person skilled in the art from this disclosure, in one or more embodiments. Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

The atomic concentration as used herein is defined as the number of atoms and ions of the target species divided by the total number of atoms and ions in said sample. If the sample is sufficiently pure, small amounts of contaminants may be neglected. In this case the atomic concentration can be expressed in terms of the N, Au and Ni atoms as follows: the atomic concentration of i is represented by i/(N+Au+Ni), wherein i is N, Au or Ni. Herein, i, N, Au and Ni are all expressed in the same unit. Example of suitable units are the number of atoms or mole.

According to the invention, the term "thickness", a portion of a layer located substantially perpendicular to its outer surface. The thickness may aim a distance from said surface, as a distance from a point below said surface.

In a first aspect, the invention relates to a gold nickel layer comprising nitrogen inserted over a thickness equal to or greater than 0.20 μm, characterized in that the atomic concentration of gold is at least 15% over said thickness, the atomic concentration of nickel is at least 10% over said thickness and the atomic concentration of nitrogen is at least 5% over said thickness.

The inventors found that the gold, nickel and nitrogen combination showed improved surface hardness without reduced conductivity properties over a pure gold-nitrogen combination. Furthermore, as the amount of gold in this layer is lower than a pure gold layer, its cost is significantly reduced. The result thus requires less gold to obtain a layer which has the beneficial conductive properties of gold as well as improved mechanical properties.

The gold alloy layers having the above characteristics are remarkable in that their hardness is considerably increased in comparison with a gold alloy layer of the same alloy composition without inserting nitrogen atoms. In addition, it can be seen that these layers are particularly resistant to corrosion.

In a further embodiment, the gold nickel layer has a thickness equal to or greater than 0.40 μm. The gold nickel layer can beneficially be created in very thin layers, such as layers thinner than 200 nm. However, thicker layers such as with a thickness over 400 nm, more preferably a thickness over 500 nm, more preferably a thickness over 600 nm, more preferably a thickness over 700 nm, more preferably a thickness over 800 nm, more preferably a thickness over 900 nm, most preferably a thickness over 1000 nm can also be created. Thicker gold nickel layers may be used for applications where high amounts of wear is expected.

In another embodiment, the atomic concentration of nitrogen in the gold nickel layer is at least 5% over a thickness equal or greater than 0.20 μm, preferably a thickness equal or greater than 0.40 μm. More preferably, the atomic concentration of nitrogen in the gold nickel layer is at least 7% over a thickness equal or greater than 0.20 μm, preferably a thickness equal or greater than 0.40 μm. More preferably, the atomic concentration of nitrogen in the gold nickel layer is at least 8% over a thickness equal or greater than 0.20 μm, preferably a thickness equal or greater than 0.40 μm. More preferably, the atomic concentration of nitrogen in the gold nickel layer is at least 10% over a thickness equal or greater than 0.20 µm, preferably a thickness equal or greater than 0.40 µm. Higher concentrations of nitrogen improve the mechanical properties, in particular the hardness, of the gold nickel layer. However at very high concentrations of nitrogen, phase transitions to inhomogeneous gold-nickel-layer alloys (such as $AuN_3$) may be formed. These inhomogeneous gold-nickel-layer alloys are unlikely to have the desired mechanical and conductive properties.

In another embodiment, the gold nickel layer comprises:
a gold dominant layer at the surface, characterized by an atomic concentration profile of at least 60% gold and at least 5% nitrogen between a depth of 0.05 µm and 0.20 µm; and
a nickel dominant layer between said gold dominant layer and a substrate, wherein said nickel dominant layer is characterized by an atomic concentration profile of at least 60% nickel at a depth equal or greater than 0.20 µm and a layer thickness of at least 0.20 µm.

It is noted that a concentration profile can be measured experimentally, for example by using a measurement method known as electron spectroscopy for chemical analysis (ESCA).

In a further preferred embodiment, the atomic concentration of nitrogen in said nickel dominant support layer is less than 10%, preferably less than 5%, most preferably less than 3%.

The inventors noted that the chemical resistance, conductivity of such a layered setup were close to those of a pure gold-nitrogen layer of the same thickness. However, the mechanical properties were further increased. Additionally, less pure gold was required to obtain a layer with improved properties. The inventors found that impregnation of nitrogen into the nickel-dominant layer was not required. Furthermore, high impregnation of nitrogen into the nickel layer was also associated with higher diffusion of nickel into the gold-dominant layer.

In another embodiment, the atomic concentration profile of nitrogen is constant over a depth between 0.05 µm and 0.20 µm, preferably over a depth between 0.05 µm and 0.40 µm.

In another embodiment, the atomic concentration profile of gold, nickel and nitrogen is constant between a depth of 0.05 and 0.20 µm, preferably over a depth of 0.05 µm and 0.40 µm.

A constant concentration profile is defined herein as having a relative deviation of the mean of the atomic concentration of less than 20%, preferably a relative deviation of the mean of the atomic concentration of less than 10%, most preferably a relative deviation of the mean of the atomic concentration which is less than 5%. For example, if the average concentration of nitrogen over the entire layer is 10%, then the concentration profile would be considered constant if the concentration of nitrogen is in the range of 8% to 12% over the entire depth of the layer. The depth of 0 to 0.05 µm was excluded to avoid surface effects and inhomogeneity.

In the most preferred embodiment, the atomic concentration of nitrogen is between 5 and 15%, the atomic concentration of gold is between 15 and 30%, and the atomic concentration of nickel is between 55 and 80% and constant between a depth of 0.05 and 0.20 µm, preferably over a depth of 0.05 µm and 0.40 µm. This quasi-homogeneous gold-nickel-nitrogen layer showed remarkable mechanical hardness and chemical resistance with an electrical conductivity close to that of pure gold.

In a second aspect, the invention relates to a process for treating a gold nickel layer, wherein said gold nickel layer to be treated is a gold nickel multilayer comprising:
a gold dominant layer at the surface, characterized by an atomic concentration profile of at least 90% gold between a depth of 0.05 µm and 0.20 µm; and
a nickel dominant layer between said gold dominant layer and a substrate, wherein said nickel dominant layer is characterized by an atomic concentration profile of at least 90% nickel at a depth equal or greater than 0.20 µm and a layer thickness of at least 0.20 µm; said process comprising a step of implantation of nitrogen ions, emitted by an energy source of at least 20 keV, preferably at least 30 keV and wherein the implanted nitrogen ions are multi-energy ions.

The gold nickel layer according to the first aspect is obtainable by the process according to the second aspect of the invention. In a preferred embodiment, the gold nickel layer according to the first aspect is obtained by the process according to the second aspect of the invention.

In a preferred embodiment of the process, the implanted multi-energy nitrogen ions comprise nitrogen ions of at least two charge states selected from the list comprising $N^+$, $N^{2+}$, $N^{3+}$, $N^{4+}$, $N^{5+}$.

In another preferred embodiment of the process, the multi-energy ions are ionized with an electron cyclotron resonance (ECR).

The invention also relates to a process for treating a gold-nickel layers comprising a step of implantation of nitrogen*-ions, emitted by a source of energy greater than or equal to 10 keV (kilo electron volts) by example greater than or equal to 20 keV, even for example greater than or equal to 30 keV, or even greater than or equal to 50 keV.

According to various modes of realization, which can in particular be combined:
the nitrogen ions implanted are multi-energy ions;
the multi-energy nitrogen ions implants comprise nitrogen ions of at least two states of charge selected from the list comprising $N^+$, $N^{2+}$, $N^{3+}$, $N^{4+}$, $N^{5+}$;
the source is an electron cyclotron resonance (ECR) source;
the electron cyclotron resonance source delivers accelerated ions by an extraction voltage and first adjustment means of an initial beam of ions emitted by said source into an implantation beam;
the multi-energy nitrogen ions are simultaneously implanted at a depth controlled by the extraction voltage of the source.

In general, it can be seen that low energies, especially between 10 and 20 keV, can lead to an increase in the sputtering phenomena of the surface gold atoms. This phenomenon can be advantageously used to obtain a surface devoid of roughness. If it is desired to limit the spraying phenomena and/or deep implant nitrogen ions, we will tend to increase their energy and can consider energies for example of the order of 100 or 200 keV for $N^+$ ions. In the case of an ECR source, the energy of the ions $N^{2+}$, $N^{3+}$, $N^{4+}$, $N^{5+}$ will be respectively double, triple, quadruple, quintuple.

The invention relates loosely to the tracking of a workpiece comprising at least a portion on the surface of which is disposed a layer of gold alloy and or said layer of gold alloy is treated.

According to different embodiments.
the nitrogen ions are ions multi energies and are implanted in the room has a floor less than or equal to 300° C.; the ion beam moves relative to the workpiece, for example at a constant speed or, for example, at a variable speed taking account of the angle of incidence of the beam, ions, relative to the surface of the piece or is disposed the layer of gold-nickel alloy to be treated.

The implantation of the nitrogen atoms can be carried out at a low temperature, for example at a temperature of less than or equal to 300° C., which can make it possible to preserve a metallurgical structure, in particular a hardening, of the workpiece. It is even possible to treat a part at temperatures of less than or equal to 100° C., for example between 50 and 60° C. These low temperatures lead to low diffusion between the nickel and gold layers, resulting in a layered structure. Nitrogen can be impregnated into both gold and nickel layers, but the diffusion of nickel into gold and gold into nickel dominant layers will be limited. This is advantageous if the gold look is desired. The temperature can be kept sufficiently low by using a sufficiently high speed of the ion beam, cooling and if needed to obtain the desired level of nitrogen impregnation, several passes over the same surface area.

Each ion produced by an ECR source has an energy that is proportional to its state of charge. It follows that the ions with the highest charge state, and therefore the highest energy, are implanted in the gold alloy part at greater depths. It will be noted at this stage of the description that this implantation is fast and inexpensive since it does not require a high extraction voltage of the ion source. Indeed, to increase the implantation energy of an ion, it is economically preferable to increase its state of charge rather than increase its extraction voltage.

It will also be noted that this device makes it possible to treat a part without altering its mechanical properties obtained by hardening (for example by treating a gold part at a temperature below 300° C.).

An ion implantation device is known from European patent application EP 2 066 829. Said ion implantation device in a gold alloy part comprises a source delivering accelerated ions by an extraction voltage and first adjustment means for an initial beam of ions emitted by said source into a beam implantation.

At a temperature below 300° C., the implantation of the ions of the implantation beam being carried out simultaneously at a depth controlled by the extraction voltage of the source. More particularly, an embodiment of the method according to the invention proposes to use multi-energy nitrogen ions produced by the source of RCE ions within which nitrogen has been introduced beforehand. implanting the ions produced simultaneously into the gold alloy part, which generates interstitial nitrogen ions in the gold structure, gold nitride microcrystals in turn inducing an increase in hardness. The simultaneous implantation of these nitrogen ions can be done at varying depths, depending on the needs and the shape of the room.

According to one embodiment, the treatment of the gold alloy by ion implantation implements a multi-energy ion beam which moves relative to the workpiece at a constant speed.

This provides means for adjusting the relative position of the part and the ion source. This may further comprise means for calculating this position from information relating to the nature of the ion beam, to the geometry of the part, at the speed of movement of the workpiece relative to the source and the number of passes previously made.

In another embodiment, nitrogen ions are implanted at a high surface temperature, such as at least 200° C., more preferably at least 250° C., most preferably more than 300° C. High surface temperatures can be achieved by combination of high nitrogen implantation energies, emitted by a source of energy greater than or equal to 10 keV by example greater than or equal to 20 keV, even for example greater than or equal to 30 keV, or even greater than or equal to 50 keV at sufficiently low ion beam speeds. The ion beam speed is the speed of the ion beam across the surface, and by keeping the ion beam directed at the surface for sufficiently long times the surface will locally be heated significantly.

By implanting nitrogen atoms at a high surface temperature, the surface will be simultaneously implanted with nitrogen ions and annealed. This annealing process allows diffusion of nickel, gold and nitrogen. If these high temperatures are held for a short period of time, the boundary between both layers becomes more gradual. If the high temperatures are maintained, the gold and nickel dominant layers disappear and a single layer of gold-nickel-nitrogen alloy is obtained. Surprisingly, this did not reduce the hardness compared to low-temperature samples likely due to the relatively high amounts of nitrogen implanted into the sample. Furthermore, high conductivity and corrosion resistance were noted. One embodiment of the method of the invention recommends the simultaneous implantation of multi-energy ions with a multi-energy beam and is therefore both technically advantageous and advantageous in terms of the physical compromise obtained (constant concentration profile).

These depths depend on the ion implantation energies of the implantation beam; they can for example vary from 0 to about 1 μm (1000 nm).

Given a different spray effect depending on the energy and the state of charge of the incident ion, the same implanted ion concentration profile is not obtained according to, for example, that it is implanted simultaneously. $N^+$, $N^{2+}$, $N^{3+}$, or that is successively implanted by increasing state of charge $N^+$, $N^{2+}$, then $N^{3+}$, or that it is successively implanted by decreasing order of charge $N^{3+}$, $N^{2+}$, then $N^+$. According to this embodiment, the successive implantation by state of charge of increasing order gives a profile of wide thickness but low concentration. Successive implantation by decreasing order of charge gives a profile of narrow thickness but of high concentration.

The increase in the hardness of the gold alloy is related to the concentration of implanted nitrogen ions as well as the concentration of nickel.

The embodiment of the method of the invention using an ECR source has an additional advantage over the implantation carried out with a mono-energy nitrogen ion beam: for the same concentration of implant ions, it is preferable to effect with a beam of multi-energy nitrogen ions the appearance of gold nitride. In addition, the simultaneous implantation of multi-energy ions can generate by collisions and cascades an efficient mixing of the different layers of gold nitride (which occur at different depths of implantation in the treated thickness)

In an application to gold nickel alloy parts, the method of the invention provides a surface hardness close to that of steel, while maintaining superior corrosion resistance and conductivity.

In a third aspect, the invention relates to a connector comprising at least a portion of a surface which comprises a gold nickel layer according to the first aspect. In a preferred embodiment, the invention relates to a connector comprising at least a portion of a surface which consists of a gold nickel layer according to the first aspect. In a further preferred embodiment, the connector comprises at least a portion of a surface which is produced by a process according to the second aspect of the invention.

Such connectors can advantageously be used as piece in electrical circuits.

The invention also relates to a part comprising at least one part on the surface of which is disposed a layer of gold comprising nitrogen atoms and whose surface nano-hardness is greater than or equal to 3.5 GPa, for example greater than or equal to 4 GPa, and/or the Vickers hardness is greater than or equal to 350 for a load of 50 g.

This is particularly advantageous over gold-nitrogen plated connectors as significantly less gold is required for superior hardness and connectivity properties.

EXAMPLES AND/OR DESCRIPTION OF FIGURES

Methodology

The sample surface morphology was characterized on a A SU8020 tabletop scanning electron microscope from Hitachi using SE and PDBSE modes and operated between 30 kV and 5 kV.

The gold layer crystalline structure (grain size and lattice parameters) was analyzed by X-ray diffraction (Empyrean model from Panalytical) equipped with a Cu anode and using a current of 40 mA and a beam voltage of 45 kV. The Bragg Brentano mode was used with a 2theta angle comprised between 10° and 100°.

The corrosion resistance evaluation was achieved with Q-FOG Cyclic Corrosion tester according to standard EN Iso 9227. The parameters are NaCl concentration of 5%±1%, temperature of 35° C.±2° C. with a pH comprised between 6.5-7.2.

The chemical composition was determined by X-ray photoelectron spectroscopy (XPS). The measures were performed on VERSAPROBE PHI 5000 from Physical Electronics, equipped with a monochromatic Al Kα X-ray source. The X-ray photoelectron spectra were collected at the take-off angle of 45° with respect to the electron energy analyzer operated in the CAE (constant analyzer energy) mode. Binding energies are all referred to the C1s peak at 284.6 eV. Photoemission spectrum background signal was subtracted using the Shirley method. Elemental composition was deduced from photoelectron peak areas taking into account the respective photoionization cross-sections, the electron inelastic mean free path, and the transmission function of the spectrometer analyzer. An argon ion gun was used for depth profiling with a kinetic energy of 3 keV.

The Ion implantation process was carried on an IonLab 400 low pressure system from Ionics Surface technologies equipped with ECR ion source (IonGun model from Ionics). Nitrogen was used to generate the plasma and produced multicharged nitrogen ions. The ion kinetic energy was fixed at 35 KeV with an ion current comprised between 2 mA and 4 mA. The implanted doses varied from 1.00 E+16 ions/cm$^2$ up to 3.00 E+17 ions/cm$^2$. The samples were fixed on a XY table moving at speeds comprised between 20 mm/sec up to 80 mm/sec.

Hardness Measurements

A series of pure gold and gold-and-nickel layers were implanted with nitrogen atoms. The hardness of the samples was consecutively tested. The results are shown in table 1.

TABLE 1

Vickers hardness of examples 1-6

| Example | Substrate | Dose (N ions/cm$^2$) | Vickers Hardness (HV) |
|---|---|---|---|
| C. Example 1 | Au | 0 (Ref) | 68.5 |
| C. Example 2 | Au | 1.00E+17 | 94.5 |
| C. Example 3 | Au | 2.00E+17 | 81.1 |
| C. Example 4 | Au + Ni | 0 (Ref) | 231.8 |
| Example 5 | Au + Ni | 1.00E+17 | 275.4 |
| Example 6 | Au + Ni | 2.00E+17 | 296.2 |

Electric Conductivity

The conductivity of each of the samples was measured. No decrease of conductivity was observed on ion implanted samples or on gold-nickel alloyed samples.

Corrosion Resistance

The corrosion resistance of comparative examples 1, 3 and 4 and example 6 was tested by subjecting both samples to a salt spray test. Each of these samples were subjected to a saline (NaCl) solution for 102 hours. After 102 hours, visual inspection of the samples was performed. All samples showed some corrosion. The nitrogen treated samples (3 and 6) showed less corrosion. There was no notable difference between samples 3 and 6.

Composition and Structure

Example 6 was created using two different ion implantation techniques. In the first, the temperature was kept sufficiently low (90° C.) to ensure two separate layers, a gold dominant and a nickel dominant layer. This was done by cooling and several passes with the ion beam. This will be referred to as example 7.

In the second technique, the temperature was raised above 200° C. by doing a single ion implantation step with a low XY table speed. This will be referred to as example 8.

The samples were then subjected to XRD analysis. A small shift in crystal parameters was noted with respect to the untreated samples. This is presumed to be the result of interstitial implanted ions (N) and/or mixing with N.

Furthermore, a significant increase in grain size was noted (up to 100% depending on lattice parameter) in the sample with high temperatures.

Examples 7 and 8 were subjected to XPS analysis. The depth profile showed two clearly distinct layers for sample 7: an outer gold-dominant layer and a nickel dominant layer between the gold outer layer and the substrate. Nitrogen was impregnated in both layers, but predominantly within the gold layer.

Example 8 showed a near constant concentration profile for nickel, gold and nitrogen between 5 and 400 nm, with deviations from the mean of less than 10% for each of the atomic concentrations. The resulting layer has a mean atomic concentration of 74% nickel, 19% gold and 7% nitrogen over this range.

The invention claimed is:
1. A gold nickel layer comprising:
 a gold dominant layer at the surface, characterized by an atomic concentration profile of at least 60% gold and at least 5% nitrogen between a depth of 0.05 μm and 0.20 μm; and a nickel dominant layer between said gold dominant layer and a substrate, wherein said nickel dominant layer is characterized by an atomic concentration profile of at least 60% nickel at a depth equal or greater than 0.20 µm and a layer thickness of at least 0.20 µm.

2. The gold nickel layer according to claim 1, wherein an atomic concentration of nitrogen in said nickel dominant layer is less than 10%.

3. The gold nickel layer according to claim 1, wherein the atomic concentration profile of nitrogen is constant over a depth between 0.05 µm and 0.20 µm.

4. The gold nickel layer according to claim 1, wherein the atomic concentration profiles of gold, nickel and nitrogen is constant between a depth of 0.05 µm and 0.20 µm.

5. The gold nickel layer according to claim 1, wherein the atomic concentration of nitrogen is between 5% and 15%, and the atomic concentration of nickel is between 60% and 80%.

6. Process for treating a gold nickel layer, wherein said gold nickel layer to be treated is a gold nickel multilayer comprising:
- a gold dominant layer at the surface, characterized by an atomic concentration profile of at least 60% gold and at least 5% nitrogen between a depth of 0.05 µm and 0.20 µm; and
- a nickel dominant layer between said gold dominant layer and a substrate, wherein said nickel dominant layer is characterized by an atomic concentration profile of at least 60% nickel at a depth equal or greater than 0.20 µm and a layer thickness of at least 0.20 µm;

said process comprising a step of implantation of nitrogen ions, emitted by an energy source of at least 20 keV, preferably at least 30 keV and wherein the implanted nitrogen ions are multi-energy ions.

7. The process according to claim 6, wherein the implanted multi-energy nitrogen ions comprise nitrogen ions of at least two charge states selected from the list comprising $N^+$, $N^{2+}$, $N^{3+}$, $N^{4+}$, $N^{5+}$.

8. The process according to claim 6, wherein said multi-energy ions are ionized with an electron cyclotron resonance (ECR).

9. The gold nickel layer obtainable by the process according to claim 7.

10. The gold nickel layer obtained by the process according to claim 7.

11. A connector comprising at least a portion of a surface which consists of a gold nickel layer made by the process of claim 6.

12. The gold nickel layer according to claim 1, wherein an atomic concentration of nitrogen in said nickel dominant layer is less than 3%.

13. The gold nickel layer according to claim 1, wherein the atomic concentration profile of nitrogen is constant over a depth between 0.05 µm and 0.40 µm.

* * * * *